(12) United States Patent
Refai-Ahmed et al.

(10) Patent No.: US 7,760,508 B2
(45) Date of Patent: Jul. 20, 2010

(54) THERMAL MANAGEMENT DEVICE FOR MULTIPLE HEAT PRODUCING DEVICES

(75) Inventors: Gamal Refai-Ahmed, Markham (CA); Robert A. Wiley, Topsfield, MA (US); Jim E. Loro, San Martin, CA (US)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 12/100,501

(22) Filed: Apr. 10, 2008

(65) Prior Publication Data

US 2008/0192441 A1 Aug. 14, 2008

Related U.S. Application Data

(62) Division of application No. 11/306,505, filed on Dec. 30, 2005, now Pat. No. 7,362,583.

(51) Int. Cl.
*H05K 7/20* (2006.01)
*F28F 7/00* (2006.01)
*H01L 23/34* (2006.01)

(52) U.S. Cl. ............ 361/719; 165/80.3; 165/185; 257/719; 361/704; 361/710

(58) Field of Classification Search ............ 257/719; 361/700–701, 719
See application file for complete search history.

(56) References Cited

U.S. PATENT DOCUMENTS

| 5,777,847 | A | 7/1998 | Tokuno et al. |
|---|---|---|---|
| 5,930,115 | A | 7/1999 | Tracy et al. |
| 5,978,223 | A | 11/1999 | Hamilton et al. |
| 6,680,848 | B2 | 1/2004 | Petit et al. |
| 6,956,392 | B2 * | 10/2005 | Wright .................. 324/760 |
| 7,283,364 | B2 * | 10/2007 | Refai-Ahmed et al. ...... 361/719 |
| 2003/0189815 | A1 | 10/2003 | Lee |
| 2007/0153483 | A1 | 7/2007 | Refai-Ahmed et al. |

* cited by examiner

*Primary Examiner*—Gregory D Thompson
(74) *Attorney, Agent, or Firm*—Vedder Price P.C.

(57) ABSTRACT

A thermal management device for a circuit substrate having at least a first heat generating component and at least a second heat generating component, the thermal management device includes a first thermal spreader and a second thermal spreader. The second thermal spreader is mountable to the circuit substrate to thermally couple with the second heat generating component. Additionally, the second thermal spreader is adapted to couple to the first thermal spreader to thermally couple the first thermal spreader to the first heat generating component when the second thermal spreader is mounted to the circuit substrate. The thermal management device also includes a bias device that is coupled to the first thermal spreader and the second thermal spreader and is adapted to maintain the thermal coupling between the first thermal spreader and the first heat generating component when the second thermal spreader is mounted to the circuit substrate.

7 Claims, 7 Drawing Sheets

THERMAL MANAGEMENT DEVICE FOR MULTIPLE HEAT PRODUCING DEVICES

RELATED CO-PENDING APPLICATION

This application is a divisional of co-pending U.S. application Ser. No. 11/306,505 filed Dec. 30, 2005, entitled "Thermal Management Device for Multiple Heat Producing Devices", having as inventors Gamal Refai-Ahmed et al., owned by instant assignee and incorporated herein by reference.

FIELD OF THE DISCLOSURE

The present disclosure generally relates to thermal management devices, and more particularly, to a thermo-mechanical device for multiple active components.

BACKGROUND

Electronic components such as integrated chips generally produce heat when operating. The heat is then transferred to an object to which the electronic component is attached and/or to the surrounding air. However, cooling solutions may be necessary for certain electronic components to maintain the operational temperature thereof below a critical temperature, which if reached, the electronic component may either not operate efficiently or fail due to heat damage.

Various known cooling solutions for such electronic components can be used. A common cooling solution is to attach a heat sink to a circuit substrate such that the heat sink is thermally coupled to the heat generating components of the circuit substrate. Accordingly, the heat sink may be either in direct contact with an outer surface of the heat generating component, or in indirect contact through an intermediate thermally conductive layer. The amount of heat conduction between the heat sink and the heat generating component may depend on the contact pressure between the heat sink and the heat generating component. To maintain the contact at a desired contact pressure, one or more spring clips are typically used to mount the heat sink to the circuit substrate such that the spring clip biases the heat sink toward the heat generating component with a desired force. The spring clip is typically mounted to the backside of the circuit substrate and coupled to the heat sink with pins or screws through corresponding apertures in the circuit substrate. Accordingly, the heat sink may not be fixedly attached to the circuit substrate, but only maintained on the circuit substrate by the biasing force of the spring clip.

In relatively small electronic devices or mobile electronic devices, such as mobile telephones, the space for accommodating one or more circuit substrates and the components mounted to the circuit substrate may be limited. For instance, a circuit assembly having one or more heat generating components, one or more thermal management devices to cool the heat generating components, and the above-described spring clip to maintain contact between the thermal management device and the heat generating components may have a collective height that exceeds the thickness requirements of the electronic device.

Therefore, there is a need for a thermal management device for use in relatively small or mobile electronic devices or in circumstances where saving space in an electronic device is necessary so as to maintain a thermal management apparatus in a desired contact with one or more heat generating components of a circuit substrate.

BRIEF DESCRIPTION OF THE DRAWINGS

The features of the present invention which are believed to be novel are set forth with particularity in the appended claims. The invention may best be understood by reference to the following description taken in conjunction with the accompanying drawings, and the several figures of which like reference numerals identify like elements.

DETAILED DESCRIPTION

The present disclosure relates to a thermal management device for a circuit substrate having at least a first heat generating component and at least a second heat generating component. The thermal management device includes a first thermal spreader and a second thermal spreader. The second thermal spreader is mountable to the circuit substrate to thermally couple with the second heat generating component. The second thermal spreader is also adapted to couple to the first thermal spreader to thermally couple the first thermal spreader to the first heat generating component when the second thermal spreader is mounted to the circuit substrate. In one embodiment of the present disclosure, the thermal management device includes a bias device coupled to the first thermal spreader and the second thermal spreader and adapted to maintain the thermal coupling between the first thermal spreader and the first heat generating component when the second thermal spreader is mounted to the circuit substrate. In another embodiment of the present disclosure, the second thermal spreader biases the first thermal spreader into thermal coupling with the first heat generating component when the second thermal spreader is mounted on the circuit substrate.

Figure 1:
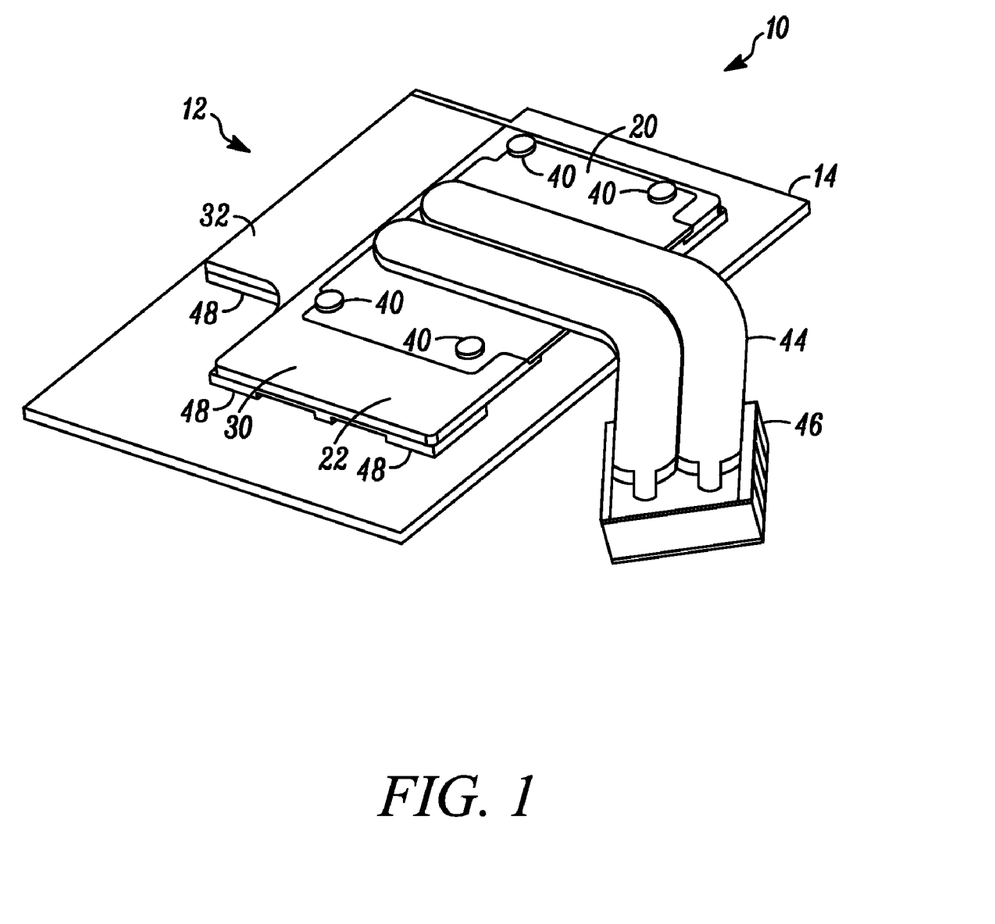
FIG. 1 is a perspective view of one embodiment of a thermal management device constructed in accordance with teachings of the present disclosure.
Figure 2:
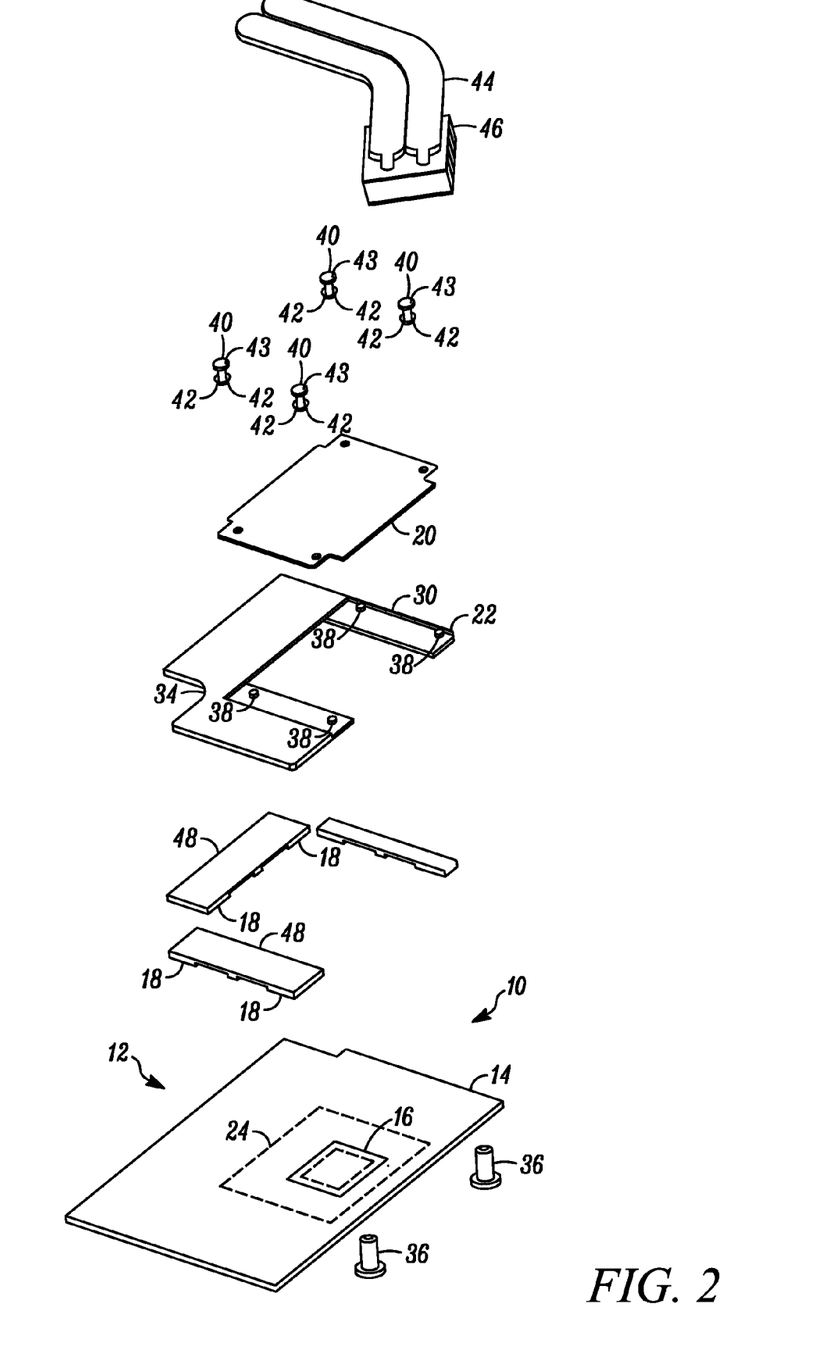
FIG. 2 is a perspective exploded view of the thermal management device of FIG. 1
Figure 3:
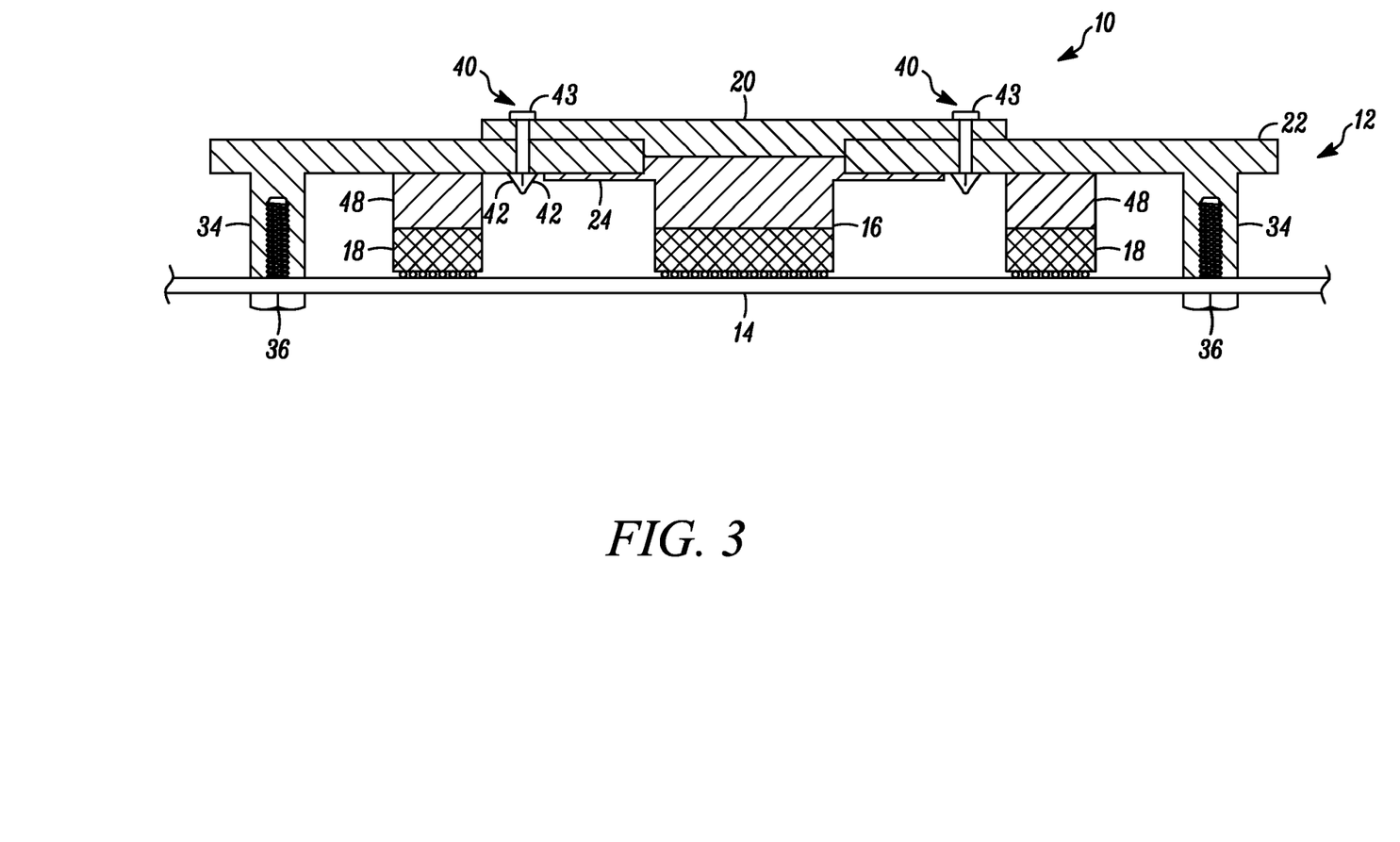
FIG. 3 is a side cross-sectional view of the thermal management device of FIG. 1

Referring to FIGS. 1-3, a circuit assembly 10 having a thermal management device 12 constructed in accordance with one embodiment of the present disclosure is shown. The circuit assembly 10 includes a circuit substrate 14, upon which the thermal management device 12 can be mounted to thermally couple with at least a first heat generating component 16 and a second heat generating component 18 of the circuit substrate 14. The thermal management device 12 includes a first thermal spreader 20 and a second thermal spreader 22 that are coupled together as will be described in the following. The second thermal spreader 22 can be mounted on the circuit substrate so as to thermally couple with the second heat generating components 18 to dissipate the heat generated by the second heat generating components 18. The first thermal spreader 20 can thermally couple with the first heat generating component 16 when the second thermal spreader 22 is mounted to the circuit substrate 14. The thermal management device 12 also includes a bias device 24 that can maintain the thermal coupling between the first thermal spreader 20 and the first heat generating component 16 when the second thermal spreader 22 is mounted on the circuit substrate 14.

The heating generating components 16 and 18 may be arranged on the circuit substrate 14 as necessary to provide the desired function of the circuit assembly 10. The heat generating components 16 and 18 may include any type of digital, analog, optical, or like device or integrated circuit that when powered or operating produce heat. In the disclosed examples, the first heat generating component 16 is shown as a processing unit and the second heat generating components 18 are shown as memory modules that are mounted adjacent two sides of the first heat generating component 16. Accordingly, in the following, the first heat generating components 16 may be referred to as the processor 16 and the second heat generating components 18 may be referred to as the memories 18. Both the processors 16 and the memories 18 may produce heat when operating. However, one of ordinary skill in the art will appreciate that the processor may typically produce more the heat than the memories 18. Accordingly, the processor 16 may require more cooling than the memories 18 to operate efficiently. The amount of contact pressure between the first thermal spreader 20 and the processor 16 may dictate the amount of heat that is dissipated from the processor 16 through the first thermal spreader 20. However, the amount of contact pressure between the processor 16 and the first thermal spreader 20 can not be excessive so as to damage the processor 16. The height of the processor 16 when mounted on the circuit substrate 14 may be greater than the height of the memories 18 when mounted on the circuit substrate 14. Accordingly, as will be described in the following, the thermal management device 12 provides sufficient contact pressure between the first thermal spreader 20 and the processor 16 and compensates for the height variation between the processor 16 and the memories 18.

The second thermal spreader 22 is configured to provide thermal coupling between itself and the memories 18 when mounted on the circuit substrate 14. Additionally, the second thermal spreader 22 is configured to couple with the first thermal spreader 20 such that when the second thermal spreader 22 is mounted on the circuit substrate 14 the first thermal spreader 20 thermally couples with the processor 16. The second thermal spreader 22 includes a first side 30 and a second side 32 that are sized, shaped and configured to mount over the memories 18 of the circuit substrate 14. The second thermal spreader 22 includes fastener conduits 38 that align with corresponding apertures (not shown) on the circuit substrate 14 so as to receive fasteners 36 from the backside of the circuit substrate 14. Accordingly, the second thermal spreader 22 can be fastened to the circuit substrate 14 with the fasteners 36. The fasteners 36 can be tightened, i.e. screwed into the fastener conduit 34. As shown in FIG. 2, a portion of the second thermal spreader 22 between the first side and the second side 34 is cut out so as to provide thermal coupling between the first thermal spreader 20 and the processor 16 when the first thermal spreader 20 is coupled to the second thermal spreader 22.

The second thermal spreader 22 includes a plurality of pin apertures 38 that are positioned on the second thermal spreader 22 to align with corresponding apertures (not shown) on the first thermal spreader 20. The pin apertures 38 receive the pins 40 from the upper side of the first thermal spreader 20 so as to maintain the first thermal spreader 20 coupled to the second thermal spreader 22. The pins 40 include pin wings 42 and pin heads 43 that prevent upward and downward movements, respectively, of the first thermal spreader 20 relative to the second thermal spreader 22. However, the pin wings 42 and the pin heads 43 may be flexible to provide slight movements of the first thermal spreader 20 relative to the second thermal spreader 22 without completely decoupling the first thermal spreader 20 from the second thermal spreader 22. Therefore, the first thermal spreader 20 is slightly moveable relative to the second thermal spreader 22, i.e., the first thermal spreader 20 floats relative to the second thermal spreader 22.

Referring to FIGS. 2 and 3, the bias device 24 may be shaped, sized and configured to provide thermal coupling between the first thermal spreader 20 and the processor 16 while preventing the first thermal spreader 20 from imparting excessive pressure on the processor 16. As shown in FIGS. 2 and 3, the bias device 24 may be rectangular and disposed between the second thermal spreader 22 and the processor 16. The bias device may be constructed from an elastic material that is thermally conductive, such as Mylar® or any other suitable material. The bias device 24 may have a hollow center portion to allow the direct thermal coupling between the first thermal spreader 20 and the processor 16. Furthermore, as shown in FIG. 3, the perimeter of the hollow center portion of the bias device 24 may be attached to the bottom portion of the first thermal spreader 20 while the outer perimeter of the bias device 24 is freely disposed between the second thermal spreader 22 and the first thermal spreader 20. Accordingly, any upward movement of the first thermal spreader 20 relative to the second thermal spreader 22 may deflect the bias device 24, thereby biasing the first thermal spreader 20 back towards thermal coupling with the processor 16. Additionally, as shown in FIG. 3, any downward force on the first thermal spreader 20 by the second thermal spreader 22 as a result of tightening the fasteners 36 can cause an upward bias in the biasing device 24 to prevent excessive contact pressure between the first thermal spreader 20 and the processor 16.

The thermal management device 12 may also include a heat carrier 44 that is mounted on the first thermal spreader 20 to direct heat from the first thermal spreader 20 toward a heat exchanger such as a heat sink 46 that is attached to the heat carrier 44. The heat carrier may be a heat pipe or any suitable structure that transfers heat from the spreader. Also, the heat exchanger is shown to be a remote heat sink and may be any suitable heat exchange structure including a fan. Additionally, to compensate for the height difference between the memories 18 and the processor 16, the thermal management device 12 may include gap fillers 48 disposed between the memories and the second thermal spreader 22. The gap fillers 48 may function to thermally couple the second thermal spreader 22 to the memories 18. Furthermore, the gap fillers 48 may also have elastic properties so as to prevent excessive pressure on the memories 18 if the fasteners 36 are tighten excessively when mounting the second thermal spreader 22 on the circuit substrate 14. The gap fillers 48 may be constructed from heat conductive foam or other suitable materials. For example, the gap fillers may be made using T-630 Chomerics made by Chomerics, Division of Parker Hannifin Corp., Woburn, Mass. or T-40Butty made by Thermagon Inc., Cleveland, Ohio, or any suitable material.

Figure 4:
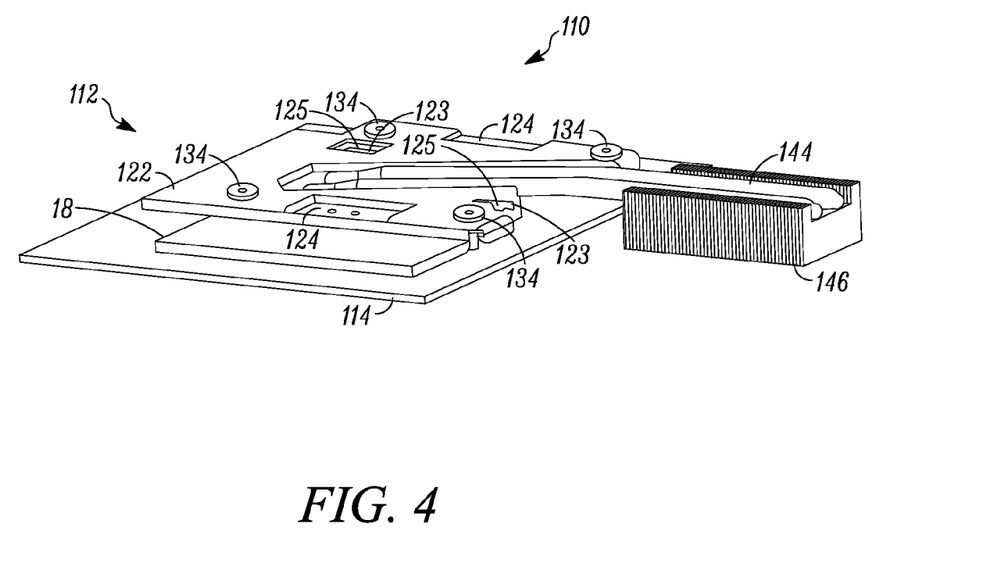
FIG. 4 is a perspective view of another embodiment of a thermal management device constructed in accordance with teachings of the present disclosure.
Figure 5:
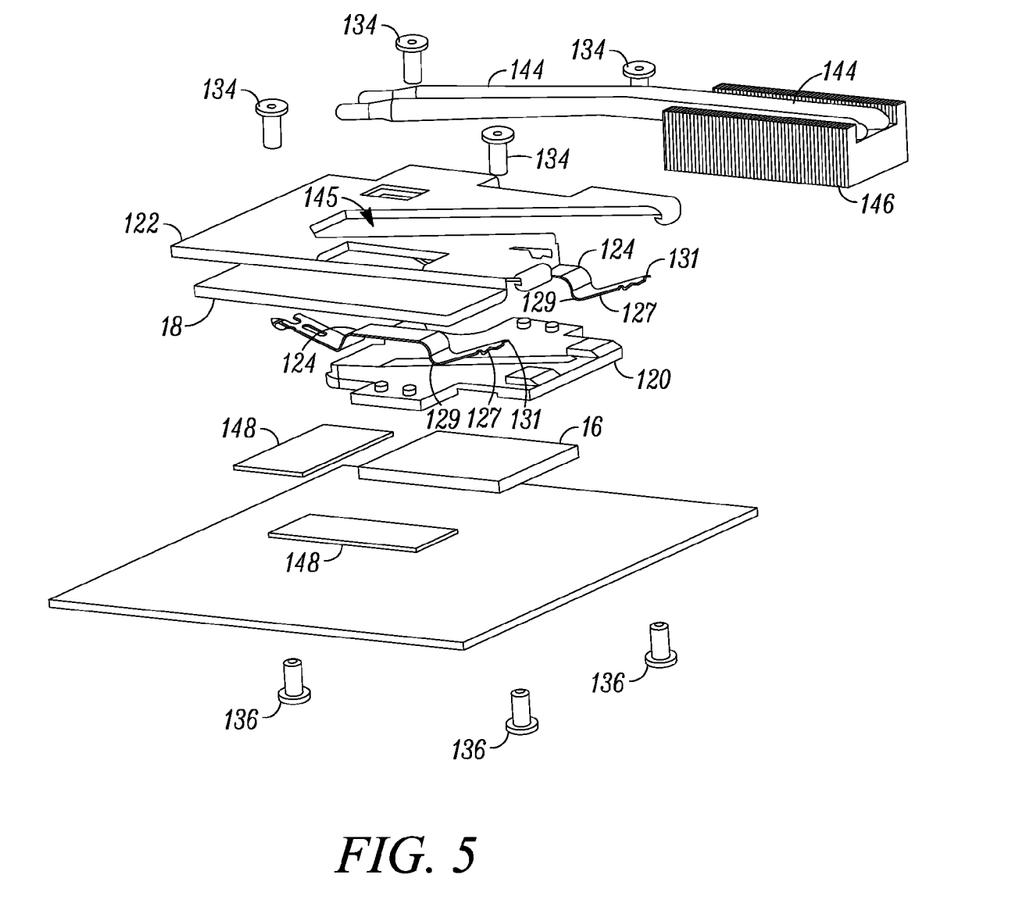
FIG. 5 is a perspective exploded view of the thermal management device of FIG. 3.

Referring to FIGS. 4 and 5, the circuit assembly 110 having a thermal management device 112 constructed in accordance with another embodiment of the present disclosure is shown. The thermal management device 112 is similar in many respects to the thermal management device 12 of FIGS. 1-3. Accordingly, the circuit assembly 110 includes a circuit substrate 114, upon which the thermal management device 112 can be mounted to thermally couple with the processor 16 and the memories 18. The thermal management device 112 includes a first thermal spreader 120 and a second thermal spreader 122 that are coupled together as will be described in the following. The second thermal spreader 122 can be mounted on the circuit substrate 114 so as to thermally couple with the memories 18 to cool the memories 18. The first thermal spreader 120 can thermally couple with the processor 16 when the second thermal spreader 122 is mounted to the circuit substrate 114. The thermal management device 112 also includes a bias device 124 that can maintain the thermal coupling between the first thermal spreader 120 and processor when the second thermal spreader 122 is mounted on the circuit substrate 114.

The second thermal spreader 122 is mounted on the circuit substrate 112 by the fasteners 136 engaging the fastener conduits 134 through corresponding apertures (not shown) in the circuit substrate 112. In the circuit assembly 110, the first thermal spreader 120 is disposed between the second thermal spreader 122 and the circuit substrate 112. Accordingly, when the second thermal spreader 122 is mounted to the circuit substrate 112 with the fasteners 136, the first thermal spreader 120 thermally couples with the processor 16 to cool the processor 16. The first thermal spreader 120 includes a pair of tabs 123 that engage corresponding slots 125 in the second thermal spreader 122. The tabs 123 are sized relative to the slots 125 so as to enable slight movement of the tabs 123 in the slots 125. Accordingly, the engagement of the tabs 123 with the slots 125 allows the first thermal spreader 120 to move, i.e. float, relative to the second thermal spreader 122, while preventing the first thermal spreader 120 to become decoupled from the second thermal spreader 122.

Because the first thermal spreader 120 is disposed between the second thermal spreader 122 and the circuit substrate 114, when the second thermal spreader 122 is fastened to the circuit substrate 112, the second thermal spreader 122 may press downward on the first thermal spreader 120 to impart pressure on the processor 18 by the first thermal spreader 120. To prevent any excessive pressure, the thermal management device 112 includes a pair of biasing devices 124 that are disposed on opposite sides of the first thermal spreader 120 and are attached to the first thermal spreader 120. As shown in FIG. 4, each biasing device 124 includes two spring-like arms 127. Each arm 127 includes an elbow 129 that contacts the circuit substrate 112 when the second thermal spreader 122 is mounted on the circuit substrate 112. Accordingly, the elbow 129 presses on the circuit substrate 112 should the fasteners 136 be excessively tightened when the second thermal spreader 122 is being mounted on the circuit substrate 114. Each arm 127 also includes a tip 131 that slidably couples to a corresponding fastener 136. Accordingly, the elbow 129 in combination with the arm 127 and the tip 131 provides a spring that prevents over tightening of the fasteners 136 to prevent excessive pressure on the processor 16 when the second thermal spreader 122 is mounted on the circuit substrate 112. However, the spring functionality of each bias device 124 also provides flexibility with a bias force so that the second thermal spreader 122 can be tightened sufficiently on the circuit substrate 112 so as to maintain proper pressure between the first thermal spreader 120 and the processor 16. Additionally, any movement of the first thermal spreader 120 away from the processor 16 will bend the arm 127 of each bias device 124 to prevent thermal decoupling between the first thermal spreader 120 and the processor 16. The bias devices 124 may be constructed from any elastic material such as a variety of plastic compound. Additionally, the bias devices 124 may be constructed with aluminum, steel, or other suitable metals.

The thermal management device 112 also includes a heat carrier 144 that is thermally coupled to the first thermal spreader 120 to dissipate the heat from the first thermal spreader 120 to a heat sink 146. Because the first thermal spreader 120 is disposed between the second thermal spreader 122 and the circuit substrate 112, the second thermal spreader 122 includes a cutout 145 that is configured to provide coupling of the heat carrier 144 with the first thermal spreader 120.

Additionally, to compensate for the height difference between the memories 18 and the processor 16, the thermal management device 112 may include gap fillers 148 disposed between the memories and the second thermal spreader 122. The gap fillers 148 may function to thermally couple the second thermal spreader 122 to the memories 18. Furthermore, the gap fillers 148 may also have elastic properties so as to prevent excessive pressure on the memories 18 if the fasteners 136 are tighten excessively when mounting the second thermal spreader 122 on the circuit substrate 114. The gap fillers 148 may be constructed from heat conductive foam or other suitable materials. For example, T630 Chomerics or any other suitable material.

Figure 6:
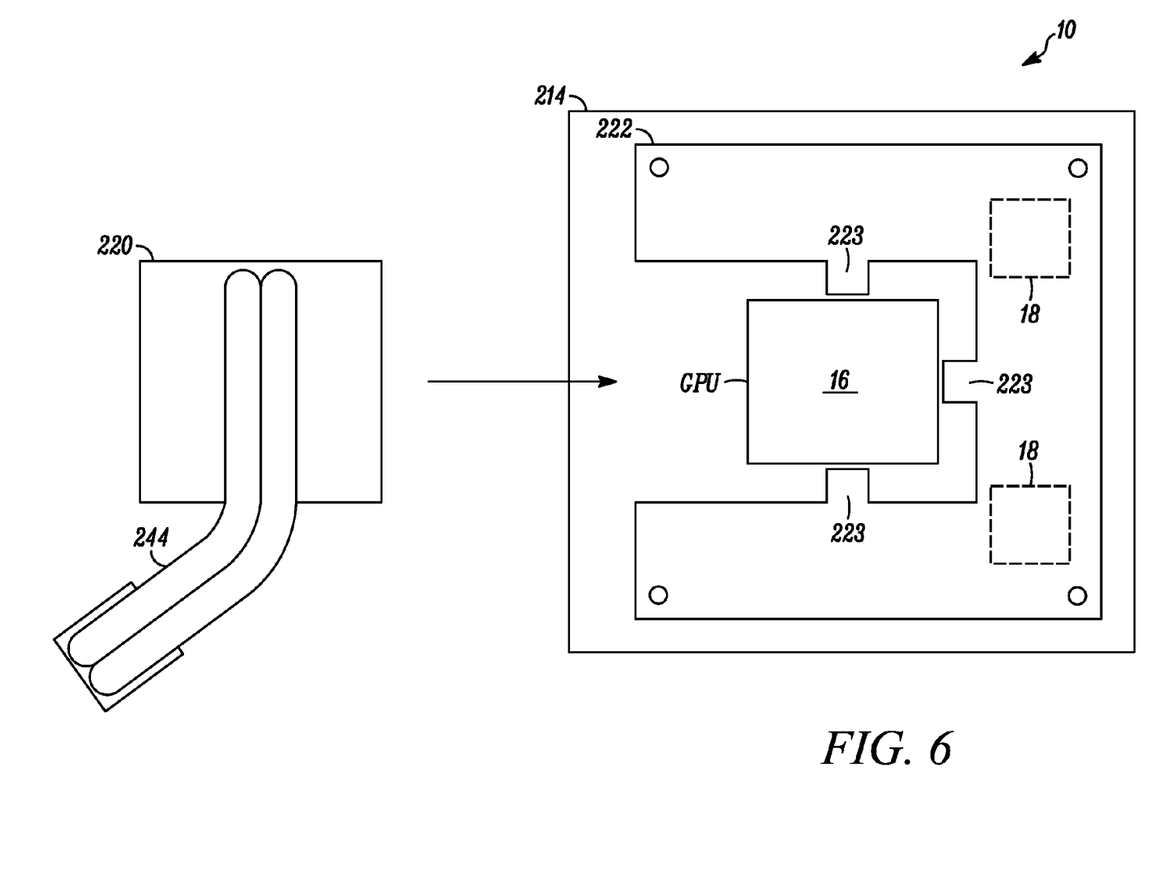
FIG. 6 is a top view of another embodiment of a thermal management device constructed in accordance with teachings of the present disclosure.
Figure 7:
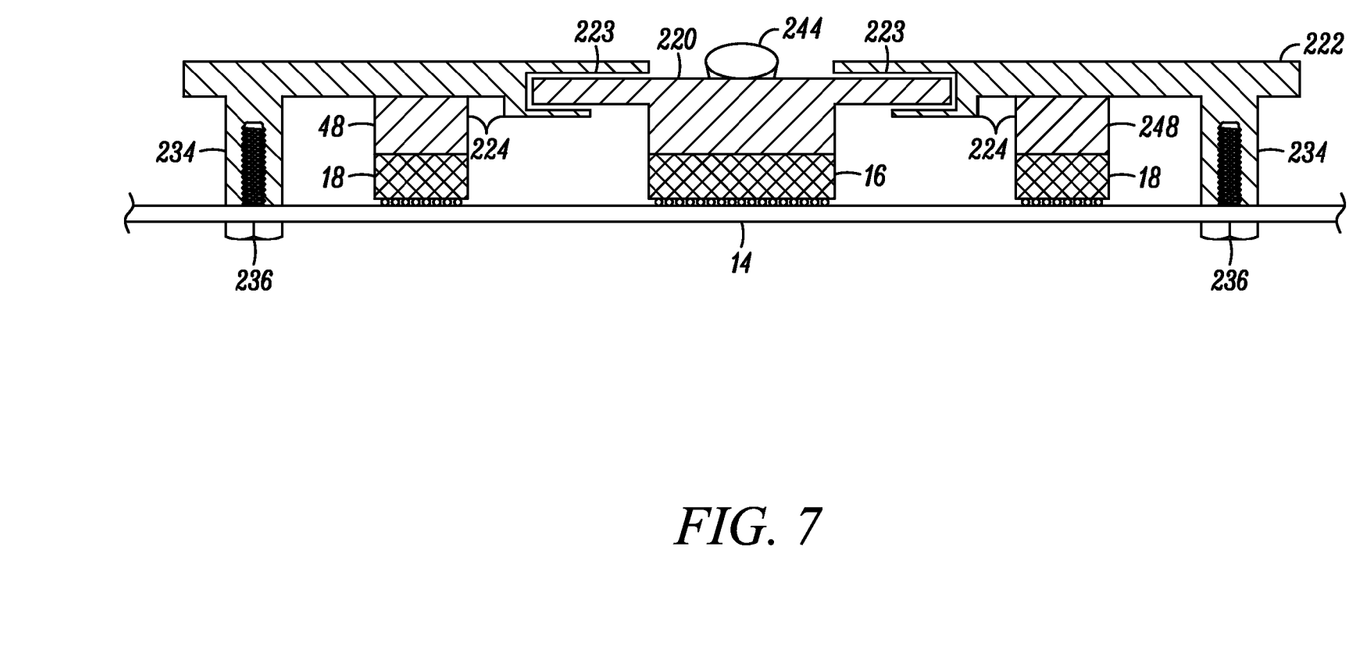
FIG. 7 is a side cross-sectional view of the thermal management device of FIG. 6.

Referring to FIGS. 6 and 7, a circuit assembly 210 having a thermal management device 212 constructed with another embodiment of the present disclosure is shown. The thermal management device 212 is similar in many respects to the thermal management device 12 of FIGS. 1-3. Accordingly, the circuit assembly 210 includes a circuit substrate 214, upon which the thermal management device 212 can be mounted to thermally couple with the processor 16 and the memories 18. The thermal management device 212 includes a first thermal spreader 220 and a second thermal spreader 222 that are coupled together as will be described in the following. The second thermal spreader 222 can be mounted on the circuit substrate 214 so as to thermally couple with the memories 18 to cool the memories 18. The first thermal spreader 220 can thermally couple with the processor 16 when the second thermal spreader 222 is mounted to the circuit substrate 214.

The second thermal spreader 222 is mounted on the circuit substrate 212 with fasteners 236 that engage fastener conduits 234 as fully described in the foregoing relative to the first and second embodiments of the present disclosure. As shown in FIG. 6, the second thermal spreader 222 is shaped so as to mount over the memories 18 to provide thermal coupling between the memories 18 and the second thermal spreader 222. Furthermore, the second thermal spreader 222 includes a cutout center portion that is sized, shaped and configured to receive the first thermal spreader 220. The perimeter of the cutout center portion of the second thermal spreader 222 includes a plurality of slots 223 that are sized, shaped and configured to receive the perimeter edge of the first thermal spreader 220. Accordingly, when the first thermal spreader 220 is inserted in the cut out of the second thermal spreader 222, the perimeter edge portions of the first thermal spreader 220 engage in the slots 223 to provide thermal coupling between the first thermal spreader 220 and the processor 16. The slots 223 are slightly larger than the thickness of the perimeter edge of the first thermal spreader 220. Accordingly, the first thermal spreader 220 can float relative to the second thermal spreader 222.

To maintain thermal coupling between the first thermal spreader 220 and the processor 16 and without imparting excessive pressure on the processor 16, both the second thermal spreader 222 and the gap fillers 248 that are disposed between the memory 18 and the second thermal spreader 222, cooperatively provide a biasing device, which will be referred to herein as the biasing device 224. The gap fillers 248 may be constructed from heat conductive foam or other suitable materials. For example, T-630 from Chomerics or any other suitable material. Accordingly, the fasteners 236 can be fastened so that the second thermal spreader 222 presses downward on the first thermal spreader 220 to provide thermal coupling between the first thermal spreader 220 and the processor 16. However, to prevent excessive pressure between the first thermal spreader 220 and the processor 16, the gap filler 248 presses upward on the second thermal spreader 222. Accordingly, the fastener 236 can be fastened so that the downward pressure from the second thermal spreader 222 on the first thermal spreader 220 counters the upward bias from the gap filler 248 on the second thermal spreader 222 to maintain sufficient pressure between the first thermal spreader 220 and the processor 16.

The invention is not limited to particular details of the apparatus and method depicted and the modifications and applications may be contemplated. Certain other changes may be made in the above-described method and apparatus without departing from the true spirit of the scope of the invention herein involved. It is intended, therefore, that the subject matter in the above depiction should be interpreted as illustrative and not in a limiting sense.

What is claimed is:

1. A thermal management device for a circuit substrate having at least a first heat generating component and at least a second heat generating component, the thermal management device comprising:
   a first thermal spreader; and
   a second thermal spreader mountable to the circuit substrate to thermally couple with the second heat generating component, the second thermal spreader applying pressure to the first thermal spreader, via a biasing device disposed between the first thermal spreader and second thermal spreader, positioning the first thermal spreader into thermal coupling with the first heat generating component when the second thermal spreader is mounted on the circuit substrate.

2. The thermal management device of claim 1, further comprising a thermally conductive gap filler disposed between the second heat generating component and the second thermal spreader and adapted to compensate for variation in height between the first heat generating component and the second heat generating component.

3. The thermal management device of claim 1, further comprising a thermally conductive gap filler disposed between the second heat generating component and the second thermal spreader and adapted to dampen movement between the first thermal spreader and the second thermal spreader.

4. The thermal management device of claim 1, further comprising at least one heat carrier thermally coupled to the first thermal spreader and operative to transfer heat to a remote heat exchanger.

5. The thermal management device of claim 1, wherein the first thermal spreader is moveably supported by the second thermal spreader when the second thermal spreader is mounted on the circuit substrate.

6. The thermal management device of claim 1, wherein the bias device comprises an elastic material.

7. The thermal management device of claim 6, wherein the elastic material is thermally conductive.

* * * * *